United States Patent
Ricciuti et al.

(10) Patent No.: US 10,042,001 B2
(45) Date of Patent: Aug. 7, 2018

(54) TESTING APPARATUS USABLE WITH CIRCUIT INTERRUPTION APPARATUS

(71) Applicant: EATON CORPORATION, Cleveland, OH (US)

(72) Inventors: Anthony Thomas Ricciuti, Bethel Park, PA (US); Thomas Kenneth Fogle, Pittsburgh, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 510 days.

(21) Appl. No.: 14/560,341

(22) Filed: Dec. 4, 2014

(65) Prior Publication Data

US 2016/0161558 A1 Jun. 9, 2016

(51) Int. Cl.
*G01R 31/28* (2006.01)
*G01R 31/327* (2006.01)

(52) U.S. Cl.
CPC ....... *G01R 31/327* (2013.01); *G01R 31/2827* (2013.01)

(58) Field of Classification Search
CPC .. G01R 31/28; G01R 31/2827; G01R 31/327; H02B 1/04; H02B 13/02; H02B 11/28; H01H 71/08; H01H 2300/042; H01H 9/26; H02J 9/06; Y10T 307/615
See application file for complete search history.

(56) References Cited

U.S. PATENT DOCUMENTS

| | | | | |
|---|---|---|---|---|
| 4,034,266 A | * | 7/1977 | Virani | H01R 13/648 335/18 |
| 5,398,275 A | * | 3/1995 | Catalin | G01T 1/2018 378/98.2 |
| 2006/0195733 A1 | * | 8/2006 | DeHaven | G01R 31/025 714/724 |
| 2010/0073002 A1 | * | 3/2010 | Chan | G01R 31/3272 324/424 |
| 2013/0241678 A1 | * | 9/2013 | Bonasia | H01H 83/04 335/18 |

* cited by examiner

Primary Examiner — Son Le
(74) Attorney, Agent, or Firm — Eckert Seamans

(57) ABSTRACT

A testing apparatus that is usable with a circuit interruption apparatus includes an enclosure that is similar to a switchgear enclosure and within which the circuit interruption apparatus for testing is received. The testing apparatus includes instrumentation that is automatically electrically connected with the circuit interruption apparatus when the circuit interruption apparatus is received within the interior region of the enclosure, and the instrumentation is operable to perform various tests on the circuit interruption apparatus. The testing apparatus further includes output devices and a switching apparatus at the exterior of the enclosure that enable a technician to control testing operations that are performed on the circuit interruption apparatus and to view the results of the testing operations. All of the electrical connections with the circuit interruption apparatus are made within the interior region of the enclosure, and the enclosure itself is configured to resist the transmission of X-rays.

15 Claims, 5 Drawing Sheets

TESTING APPARATUS USABLE WITH CIRCUIT INTERRUPTION APPARATUS

BACKGROUND

Field

The disclosed and claimed concept relates generally to electrical interruption equipment and, more particularly, to a testing apparatus that is usable to test a circuit interruption apparatus.

Related Art

Numerous types of circuit interruption devices are known in the relevant art and are used to interrupt current in a protected portion of a circuit in certain predefined overcurrent conditions, under-voltage conditions, and other conditions. Circuit interruption devices that are intended to be resettable after opening a protected portion of a circuit typically include a set of separable electrical contacts which, when moved from a position in contact with one another to a position spaced apart from one another, cause the protected portion of the circuit to be moved from the closed condition to the open condition. In certain applications, the set of separable contacts may be situated within a vacuum bottle to facilitate arc extinction between the set of separable contacts. It is likewise known in the relevant art, however, that the energy that is dissipated in extinguishing an arc can eventually result in wear on the separable contacts, the vacuum bottle, and on other parts of the circuit interruption device. Moreover, other environmental and other conditions can affect the set of separable contacts, the vacuum bottle, and the other portions of the circuit interruption device.

It thus is desirable to periodically perform a testing operation on a circuit interruption device if it has been in service for a period of time. Such testing might involve a primary resistance test wherein the resistance across the set of separable contacts in the closed position is measured by applying a high level current across the contacts and measuring the voltage drop, or alternatively this potentially can be done by applying an ohmmeter across the closed contacts. Other testing can include a vacuum integrity test wherein a high voltage is applied across the contacts in their open position, and the current flow across the open contacts is measured with the use of an ammeter.

Similar high voltages are applied during insulation integrity testing. Some circuit interruption apparatuses can include accessory devices such as charging motors, under-voltage relays, trip coils, closing coils, and the like, and it may also be desirable to test one or more of the included accessory devices.

Such testing has previously involved a meaningful degree of danger since a circuit interruption device must be removed from, say, the protective environment of its switchgear cabinet and must then have its line and load conductors connected with various electrical cables that are connected with various electrical supplies that are outside the protective environment of the switchgear. Such application of high voltage and/or high current to the exposed circuit interruption device is problematic because electrical cables and conductors are exposed, sometimes lying on the floor, and can create hazards in a busy industrial environment. Moreover, the high current involved with vacuum integrity testing generates X-rays which are themselves hazardous in anything other than minimal amounts. Improvements thus would be desirable.

SUMMARY

An improved testing apparatus that is usable with a circuit interruption apparatus includes an enclosure that is similar to a switchgear enclosure and within which the circuit interruption apparatus for testing is received. The testing apparatus includes instrumentation that is automatically electrically connected with the circuit interruption apparatus when the circuit interruption apparatus is received within the interior region of the enclosure, and the instrumentation is operable to perform various tests on the circuit interruption apparatus. The testing apparatus further includes output devices and a switching apparatus at the exterior of the enclosure that enable a technician to control testing operations that are performed on the circuit interruption apparatus and to view the results of the testing operations. All of the electrical connections with the circuit interruption apparatus are made within the interior region of the enclosure, and the enclosure itself is configured to resist the transmission of X-rays therethrough, which enables testing to be performed without the hazards previously known to be associated with such testing.

Accordingly, an aspect of the disclosed and claimed concept is to provide an improved testing apparatus that is usable to perform needed testing operations on a circuit interruption apparatus.

Another aspect of the disclosed and claimed concept is to provide such a testing apparatus that avoids dangers previously known to be associated with the testing of circuit interruption devices.

Another aspect of the disclosed and claimed concept is to provide a testing apparatus that includes internally therein all of the instrumentation and electrical connections that are needed to connect with and perform testing on a circuit interruption apparatus, and which will be automatically connected with the circuit interruption apparatus when it is received within an interior region of the testing apparatus.

Accordingly, an aspect of the disclosed and claimed concept is to provide an improved testing apparatus that is structured to perform a number of operations on a circuit interruption apparatus. The testing apparatus can be generally stated as including an enclosure having an interior region and comprising a number of walls that are situated adjacent the interior region, the walls being structured to substantially enclose the circuit interruption apparatus within the interior region, a connection apparatus that can be generally stated as including a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region, a measurement apparatus that can be generally stated as including at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto, and an output apparatus connected with the measurement apparatus and that can be generally stated as including at least a first output device that is structured to generate an output that is representative of a result of the testing operation.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

Figure 1:
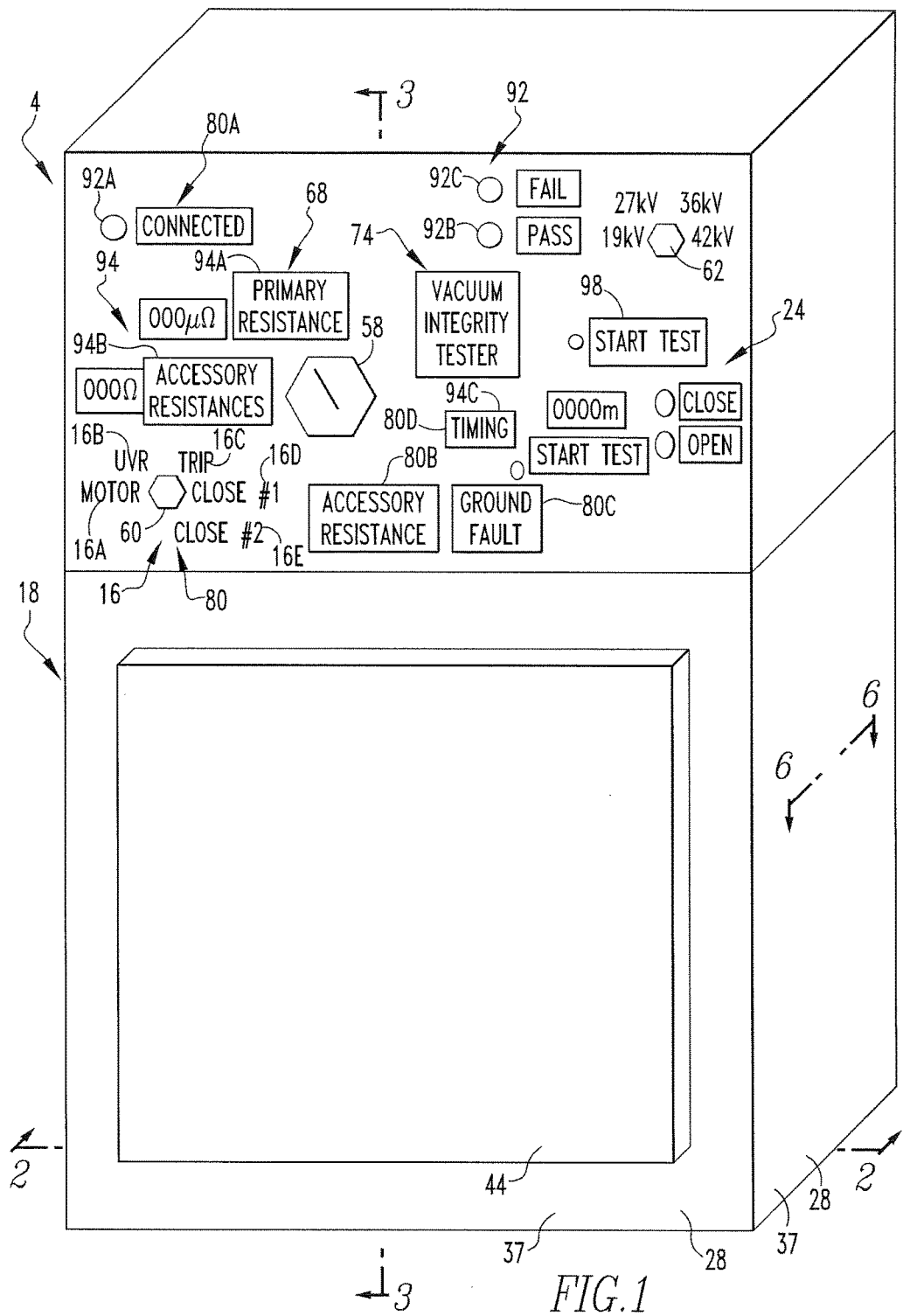
FIG. 1 is an elevation perspective view of an improved testing apparatus in accordance with the disclosed and claimed concept.

An improved testing apparatus 4 in accordance with the disclosed and claimed concept is depicted generally in FIG. 1 and is depicted in part in FIGS. 2-6. The improved testing apparatus 4 is advantageously used to perform various tests on a circuit interruption apparatus 6 of the type that is depicted generally in FIGS. 3 and 4. The circuit interruption apparatus 6 in the depicted exemplary embodiment is a vacuum interrupter having a number of line connectors 8, a number of load connectors 10, and an interruption apparatus 12. As employed herein, the expression "a number of" and variations thereof shall refer broadly to any non-zero quantity, including a quantity of one. The interruption apparatus 12 includes a set of separable contacts that are movable between a closed position wherein the circuit interruption apparatus 6 is in an ON condition and an open position wherein the circuit interruption apparatus 6 is in an OFF condition. In the ON condition, the line and load connectors 8 and 10 of each pole are electrically connected together, it being noted that only a single such pole is depicted herein for purposes of clarity. The circuit interruption apparatus 6 further includes a connection block 14 that is electrically connected with a number of accessory devices 16 that will be described in greater detail below.

The testing apparatus 4 can be generally said to include an enclosure 18, a connection apparatus 20, a measurement apparatus 22, and an output apparatus 24. The connection apparatus 20, the measurement apparatus 22, and the output apparatus 24 are situated generally on the enclosure 18.

The enclosure 18 includes a number of walls 28 that are situated adjacent an interior region 26 within which the circuit interruption apparatus 6 is receivable (as is depicted generally in FIGS. 3 and 4) for testing. The walls 28 are each situated adjacent the interior region 26. The enclosure 18 has an opening 30 formed therein that is in communication with the interior region 26 and further includes a divider 32 disposed within the interior region 26 that divides the interior region 26 into an upper chamber 34 and a lower chamber 36. In the depicted exemplary embodiment, the walls 28 are formed of a material such as steel or other appropriate material that is resistant to the penetration of X-rays therethrough. In the depicted exemplary embodiment, generally each of the walls 28 includes an exterior layer 37 (FIG. 6) and a layer of shielding material 38 adjacent thereto, with the exterior layer 37 being formed of steel, and with the layer of shielding material 38 being formed of a material such as lead. In other embodiments, however, the walls 28 may be formed of a single layer of material that is resistant to the penetration of X-rays or may be any combination of layers of materials that together resist the penetration of X-rays therethrough.

The enclosure 18 additionally includes a set of rails 40 upon which the circuit interruption apparatus 6 can be received to enable the circuit interruption apparatus 6 to be rolled, slid, or otherwise moved into the interior region 28 and into electrical connection with the connection apparatus 20. The enclosure 18 further includes a jackscrew 42 that is threadably connectable with the circuit interruption apparatus 6 and which can be rotated in a known fashion to advance the circuit interruption apparatus 6 into the interior region 26 and into electrical connection with the connection apparatus 20. In this regard, it is understood that the enclosure 18 and the connection apparatus 20 are configured to be substantially similar to a switchgear cabinet (not expressly depicted herein) of the type within which the circuit interruption apparatus 6 would be received during normal operation of the circuit interruption apparatus 6. Further in this regard, and as will be set forth in greater detail below, when the circuit interruption apparatus 6 is fully received in the interior region 26, its line and load connectors 8 and 10 and its connection block 14 are automatically electrically connected with the connection apparatus 20, which is substantially the same fashion as the line and load connectors 8 and 10 and the connection block 14 are automatically connected with conductive elements within the interior of a switchgear cabinet when the circuit interruption apparatus 6 is received therein.

Figure 3:
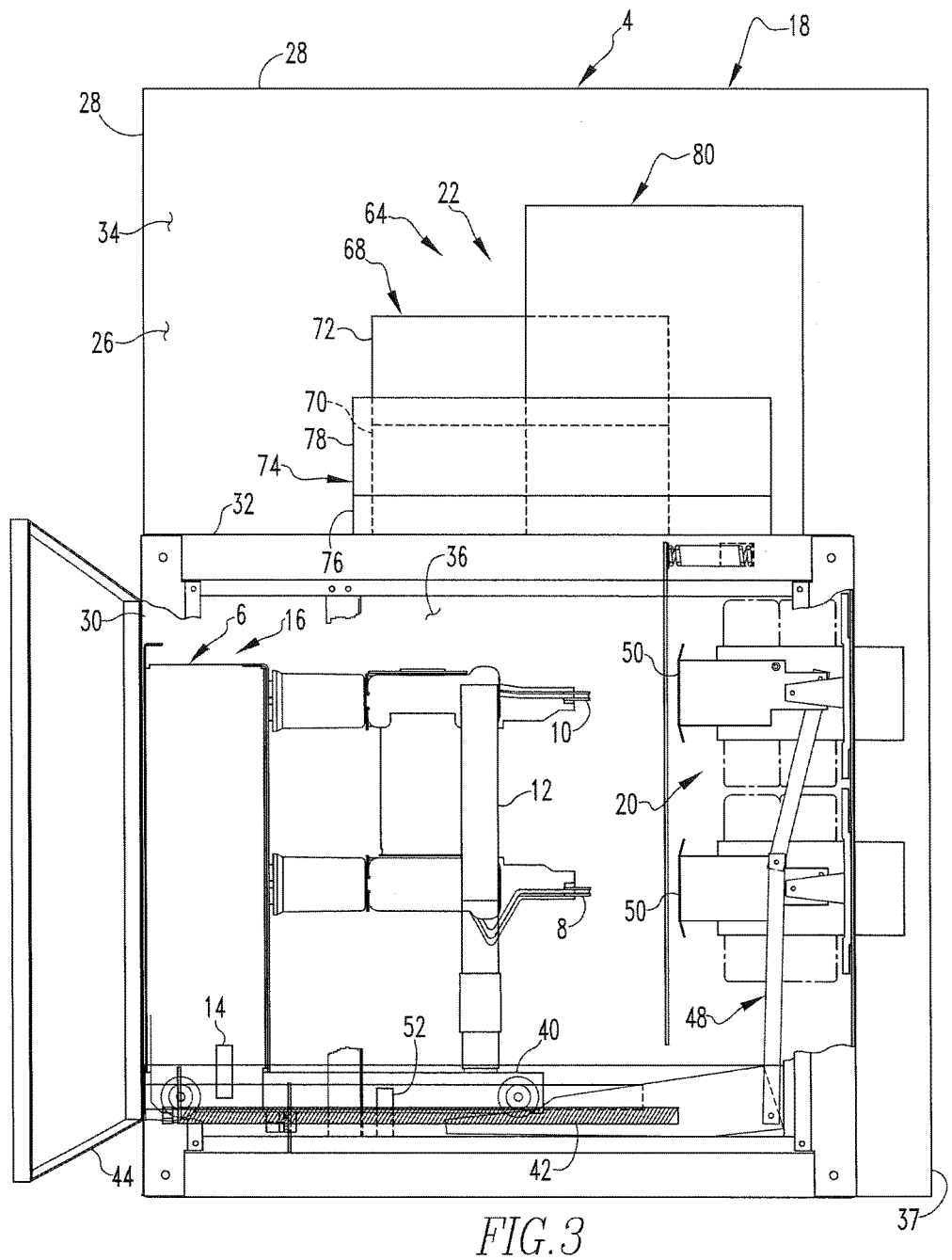
FIG. 3 is a sectional view as taken along line 3-3 of FIG. 1 and additionally depicts a door of the testing apparatus being in an open condition and a circuit interruption device being partially received in an interior region of the testing apparatus.

The enclosure 18 further includes a door 44 that is movable between a closed position such as is depicted generally in FIG. 1 and an open condition such as is depicted generally in FIG. 3. The door 44 in the closed position overlies the opening 30 and separates the interior region 26 from the exterior of the enclosure 18. When the door 44 is in the open position, the interior region 26 is exposed to the exterior of the enclosure 18, and the circuit interruption apparatus 6 can be received in the interior region 26 and can additionally be removed therefrom.

Figure 2:
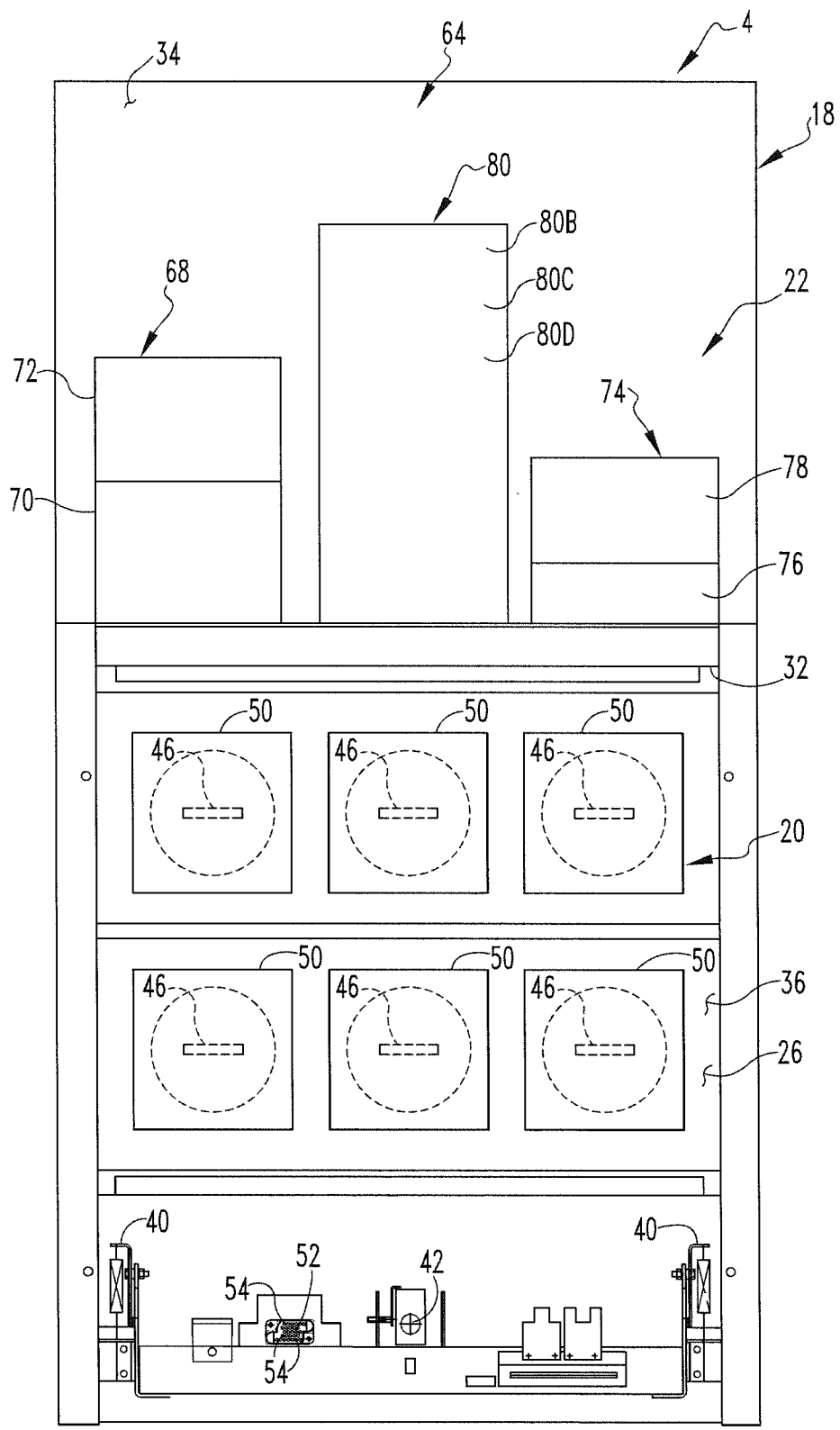
FIG. 2 is a sectional view as taken along line 2-2 of FIG. 1.
Figure 4:
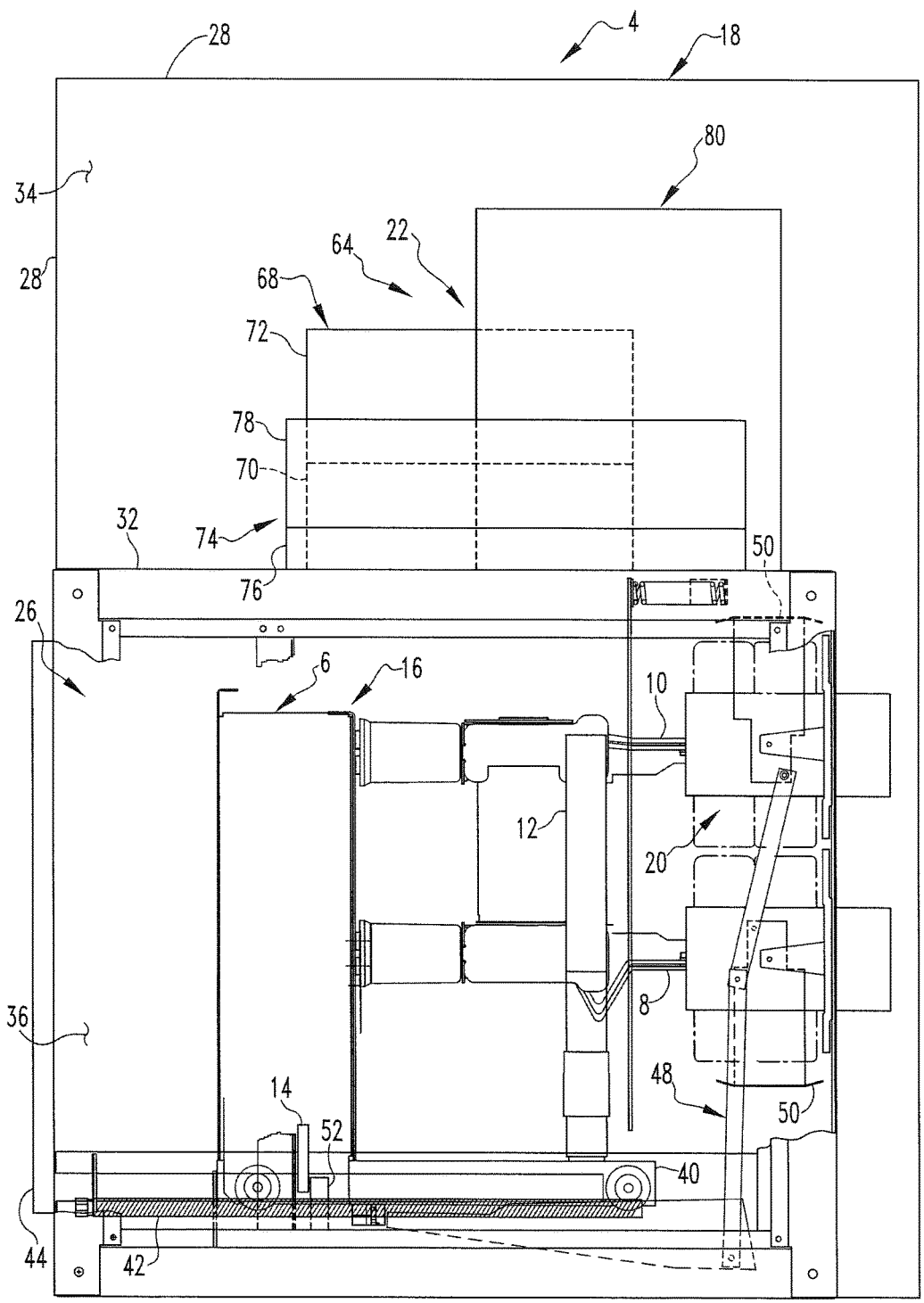
FIG. 4 is a view similar to FIG. 3, except depicting the door in a closed position and showing the circuit interruption apparatus electrically connected with the testing apparatus.

As can be understood from FIGS. 2 and 4, the connection apparatus 20 can be said to include a set of primary connectors 46 which, in the depicted exemplary embodiment, are a set of stabs that are situated within the interior region 26. The connection apparatus 20 further includes a guard apparatus 48 that is engageable by the circuit interruption apparatus 6 when the circuit interruption apparatus 6 is being received in the interior region 26. The guard apparatus 28 includes a number of guard elements 50 that are movable between a first position overlying the primary connectors 46, such as is depicted generally in FIG. 3 when the circuit interruption apparatus 6 is disengaged from the guard apparatus 48, and a second position wherein the guard elements 50 are offset or are otherwise displaced from the primary connectors 46, such as is depicted generally in FIG. 4 when the circuit interruption apparatus 6 is fully received in the interior region 26. The guard apparatus 48 is similar to that which is included in a conventional switchgear cabinet, and it is included with the testing apparatus 4 in order to alert a technician if for whatever reason the circuit interruption apparatus 6 is unable to successfully operate the guard apparatus 48 to expose the primary connectors 46.

The connection apparatus 20 further includes a connection plug 52 having a plurality of secondary connectors 54 that are connected with certain instrumentation of the measurement apparatus 22, as will be set forth in greater detail below. The connection plug 52 is automatically electrically connected with the connection block 14 when the circuit interruption apparatus 6 is fully received in the interior region 26.

The connection apparatus 20 can additionally be said to include a switching apparatus 56 which, in the depicted exemplary embodiment shown in FIG. 1, includes a primary selector 58, a secondary selector 60, and a voltage selector 62. The primary selector 58 can be manipulated by a technician to select any of a variety of primary tests that will be performed on the circuit interruption apparatus 6, whereas the secondary selector is operable by the technician to select any of the accessory devices 16 for testing by the testing apparatus 4. The voltage selector 62 is switched by the technician to correspond with the voltage rating of the circuit interruption apparatus 6 that is undergoing testing.

The measurement apparatus 22 can be said to include a set of instruments 64 and a set of leads 66. In the depicted exemplary embodiment, the set of instruments 64 can include a primary resistance tester 68 that includes a power component 70 in the form of a transformer 70 that is situated in the upper chamber 34 and a measurement component 72 that is in the exemplary form of a voltmeter that is situated on the front wall of the enclosure 18. In other embodiments, the measurement component 72 potentially can be an ohm-meter or other device without departing from the present concept. The exemplary set of instruments 64 further includes a vacuum integrity tester 74 that includes a power component 76 in the form of a transformer that is situated in the upper chamber 34 and a measurement component 78 in the exemplary form of an ammeter that is situated on the front wall of the enclosure 18. Since the circuit interruption apparatus 6 is received in the lower chamber 36, and since the power components 70 and 76 are received in the upper chamber 34, the divider 32 advantageously separates the power components 70 and 76 from the circuit interruption apparatus 6. This is desirable to avoid damage to the power components 70 and 76 in the event of an electrical fault event in the lower chamber 36.

The set of instruments 64 can further be said to include a number of secondary instruments 80 that each include a measurement component and that are connected via wires or other conductors with the secondary connectors 54. The secondary instruments 80 will be described in greater detail below.

The set of leads 66 in the depicted exemplary embodiment can be said to include a set of power leads 82 and a set of measurement leads 84 and may additionally include one or more ground conductors. The power leads 82 are electrically connected between the primary connectors 46 and the primary selector 58, and the measurement leads 84 are likewise electrically connected between the primary connectors 46 and the primary selector 58. The set of leads 66 can be said to further include additional wiring 86, FIG. 5, that extends between the primary selector 58 and certain instrumentation of the set of instruments 64. The additional wiring 86 that is depicted in a schematic fashion in FIG. 5 includes a set of first connection wires 88 that extend between the primary selector 58 and the primary resistance tester 68. The additional wiring 86 further include a second set of connection wires 90 that electrically extend between the primary selector 58 and the vacuum integrity tester 74.

Figure 5:
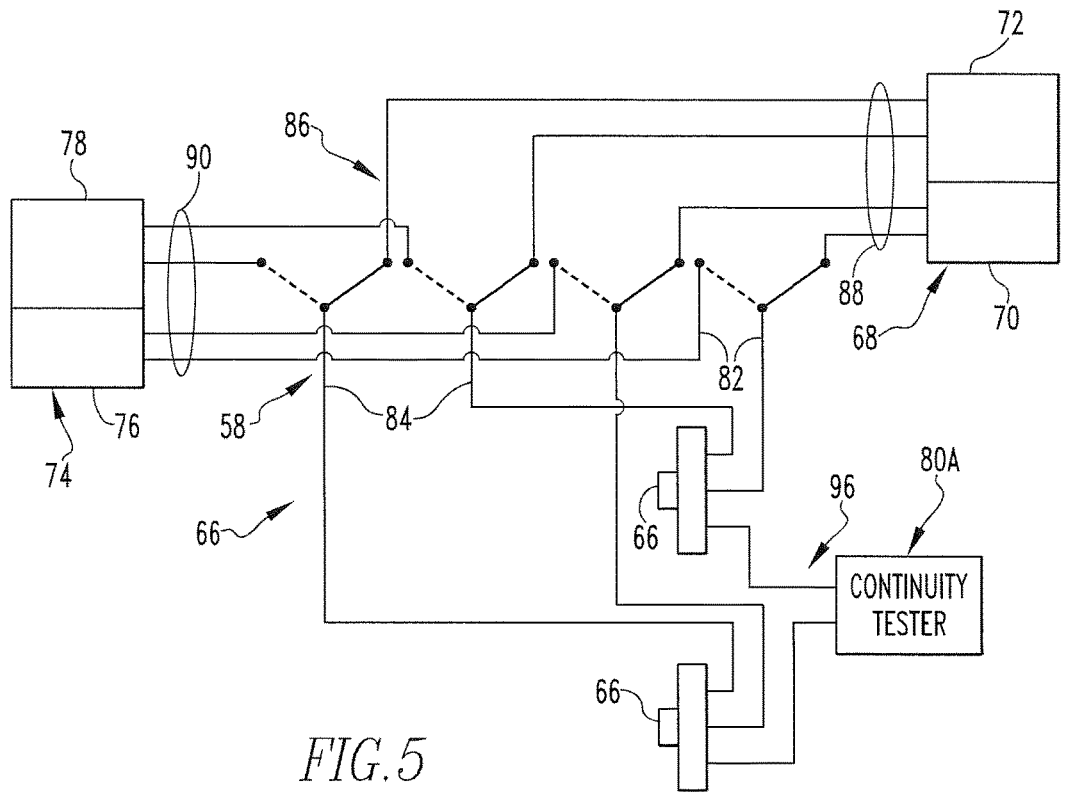
FIG. 5 is a schematic depiction of a portion of a connection apparatus of the testing apparatus of FIG. 1.
Figure 6:
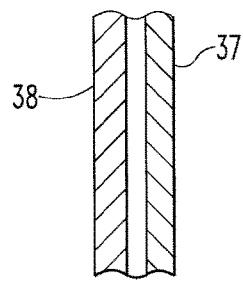
FIG. 6 is a sectional view as taken along line 6-6 of FIG. 1.

As is schematically depicted in FIG. 5, the primary selector 58 is switchable between one condition wherein the primary resistance tester 68 is electrically connected with the set of leads 66 and another condition (depicted in dashed lines in FIG. 5) wherein the vacuum integrity tester 74 is electrically connected with the set of leads 66. In the one condition of FIG. 5, a number of conductors within the primary selector 58 electrically connect together the first connection wires 88 and the set of leads 66 while the second connection wires 90 remain electrically disconnected from the set of leads 66. In such a condition, the primary resistance tester 68 is electrically connected with the primary connectors 46 and thus with the circuit interruption apparatus 6 and can be operated to perform a primary resistance test on the circuit interruption apparatus 6. In the other condition depicted in dashed lines in FIG. 5, the secondary connection wires 90 are electrically connected with the set of leads 66 while the first connection wires 88 remain electrically disconnected from the set of leads 66, whereby the vacuum integrity tester 74 is electrically connected with the circuit interruption apparatus 6 and can perform thereon a vacuum integrity test. It is understood that FIG. 5 is intended to schematically depict only the switching of the primary selector 58 between the primary resistance tester 68 and the vacuum integrity tester 74, and it is further understood that the primary selector 58 is further operable to electrically disconnect both the primary resistance tester 68 and the vacuum integrity tester 74 from the circuit interruption apparatus 6 and to instead electrically connect with the circuit interruption apparatus 6 other instrumentation of the set of instruments 64. The secondary selector 60 is likewise operable to selectively connect certain of the instruments of the set of instruments 64 with the various accessory devices 16 of the circuit interruption apparatus 6.

The output apparatus 24 in the depicted exemplary embodiment includes a plurality of output devices that are situated on the front wall of the enclosure 18 and include a variety of visual output devices such as various indicator lamps 92 and various display screens 94. Various other types of output devices may be desirable and within the scope of the present concept depending upon the needs of the particular application.

The exemplary indicator lamps 92 include a continuity indicator lamp 92A of a continuity tester 80A, and further include a PASS lamp 92B and a FAIL lamp 92C that are associated with the vacuum integrity tester 74, which may be collectively or individually referred to herein with the numeral 92. The display screens 94 may include a digital display 94A for the primary resistance tester 68, a digital display 94B for an accessory resistance tester 80B, and a digital display 94C for a timing tester 80D.

The set of secondary instruments 80 includes the aforementioned continuity tester 80A, the accessory resistance tester 80B, and the timing tester 80D, and it additionally includes an accessory ground fault detector 80C, all of which may be individually or collectively referred to herein with the numeral 80. The various secondary instruments 80 are represented by textual labels that appear on the front wall of FIG. 1 in conjunction with the tests that are performed thereon.

The continuity tester 80A includes a set of continuity leads 96 that are electrically connected with the primary connectors 46 and which cause the indicator lamp 92A to become illuminated when the circuit apparatus 6 in its ON condition is electrically connected with the primary connectors 46.

The secondary selector 60 is operable to select among a set of accessory testing operations that are represented by textual labels on the front wall of the enclosure 18. Such textual labels are more particularly representative of the secondary instruments 80 each having a measurement component and being electrically connected with a number of accessory connectors or accessory leads that extend from one of one of the accessory devices 16 of the circuit interruption apparatus 6 via electrical connection between the connection block 14 and the connection plug 52. The exemplary accessory devices 16 that are tested by the exemplary testing apparatus 4 include a charging motor 16, an under-voltage relay 16B, a trip coil 16C, a closing coil 16D, and a backup closing coil 16E, which may be individually or collectively referred to herein with the numeral 16. The secondary selector 60 is manipulated to select the particular accessory device 16 that is to be tested, and the primary selector 58 is manipulated to select the particular secondary test that will be applied to the selected accessory device 16. That is, the primary selector 58 is manipulated to select a secondary instrument 80 that will, during testing, be applied to the accessory device 16. In the depicted exemplary embodiment, the primary selector 58 can select either the accessory resistance tester 80B or the accessory ground fault detector 80C.

The testing apparatus additionally includes a START button 98 which, when actuated, initiates the test that is selected by the position of the primary selector 58. If the primary selector 58 is set to operate any of the secondary instruments 80, such as the accessory resistance tester 80B and the accessory ground fault detector 80C, the position of the secondary selector 60 will determine the particular accessory device 16 that will be subjected to the testing operation. If the accessory resistance tester 80B has been selected by the primary selector 58, the result of the test will be output on the accessory resistance display screen 94B, but if the accessory ground fault detector 80C has instead been selected by the primary selector 58, the result of the test will be output by illuminating one of the PASS indicator lamp 92B and the FAIL indicator lamp 92C.

It is noted that the timing tester 80D measures and outputs the period of time beginning with the initiation of a trip or an opening of the set of separable contacts and ending at the time at which the interruption apparatus 12 is sufficiently opened to stop the flow of current through the circuit interruption apparatus 6. Operating the timing tester 80B can include an automatic actuation of, for instance, the trip coil 16C or the under-voltage relay 16B, and will measure the period of time between the initiation of the trigger and the point at which the continuity tester 80A indicates a lack of continuity between the line and load connectors 8 and 10. The measured period of time is measured on the display screen 94C.

After the desired amount of testing operations have been performed on the circuit interruption apparatus 6, the door 44 can be opened and the jackscrew 42 operated to disengage the circuit interruption apparatus 6 from the connection apparatus 20 and move the circuit interruption apparatus 6 to a location in the opening 30 where it can be removed from the interior region 26.

It thus can be seen that the improved testing apparatus 4 incorporates various instrumentation and equipment in a singular location that enables the circuit interruption apparatus 6 to be subjected to testing within an enclosed and secure environment that is safe to those around it. Other advantages will be apparent.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A testing apparatus that is structured to perform a number of operations on a circuit interruption apparatus, the testing apparatus comprising:
    an enclosure having an interior region and comprising a number of walls that are situated adjacent the interior region, the enclosure being structured to removably receive the circuit interruption apparatus therein, the walls being structured to substantially enclose the circuit interruption apparatus within the interior region;
    a connection apparatus comprising a set of primary connectors mounted to the enclosure and situated generally within the interior region, the set of primary connectors being structured to automatically become electrically connected with a corresponding set of line and load electrical connectors of the circuit interruption apparatus when the circuit interruption apparatus is received in the interior region;
    a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto; and
    an output apparatus connected with the measurement apparatus and comprising at least a first output device that is structured to generate an output that is representative of a result of the testing operation.

2. The testing apparatus of claim 1 wherein the connection apparatus further comprises a set of secondary connectors that are situated within the interior region and that are structured to become electrically connected with a corresponding set of accessory connectors of a number of accessory devices of the circuit interruption apparatus when the circuit interruption apparatus is received in the interior region, the set of secondary connectors being electrically connected with the measurement apparatus, the measurement apparatus comprising a number of secondary instruments and being structured to perform a number of measurement operations on at least a first accessory of the number of accessories, output apparatus being structured to generate an output that is representative of a result of the number of measurement operation.

3. The testing apparatus of claim 1 wherein the number of walls have formed therein an opening that is structured to receive the circuit interruption apparatus therethrough when the circuit interruption apparatus is being received into the interior region and when the circuit interruption apparatus is being removed from the interior region, and wherein the number of walls comprise a door that is movable between an open position and a closed position and which in the closed position is structured to close the opening.

4. The testing apparatus of claim 1 wherein the number of walls comprise a divider that divides the interior region into a chamber and another chamber, wherein the power component is situated within the chamber, and wherein the set of primary connectors are situated within the another chamber, the another chamber being structured to receive the circuit interruption apparatus therein.

5. The testing apparatus of claim 1 wherein the enclosure comprises a layer of a shielding material that is structured to resist the transmission of X-rays between the interior region and the exterior of the testing apparatus.

6. The testing apparatus of claim 5 wherein the layer of shielding material is situated generally adjacent at least a portion of the number of walls.

7. A testing apparatus that is structured to perform a number of operations on a circuit interruption apparatus, the testing apparatus comprising:
  an enclosure having an interior region and comprising a number of walls that are situated adjacent the interior region, the walls being structured to substantially enclose the circuit interruption apparatus within the interior region;
  a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;
  a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto;
  an output apparatus connected with the measurement apparatus and comprising at least a first output device that is structured to generate an output that is representative of a result of the testing operation;
  wherein the connection apparatus further comprises a set of secondary connectors that are situated within the interior region and that are structured to become electrically connected with a corresponding set of accessory connectors of a number of accessory devices of the circuit interruption apparatus when the circuit interruption apparatus is received in the interior region, the set of secondary connectors being electrically connected with the measurement apparatus, the measurement apparatus comprising a number of secondary instruments and being structured to perform a number of measurement operations on at least a first accessory of the number of accessories, output apparatus being structured to generate an output that is representative of a result of the number of measurement operation; and
  wherein at least one secondary instrument of the number of secondary instruments comprises a measurement component that is structured to perform at least one measurement operation of the number of measurement operations that comprises at least one of an electrical resistance measurement of the at least first accessory and a ground fault detection operation on the at least first accessory.

8. A testing apparatus that is structured to perform a number of operations on a circuit interruption apparatus, the testing apparatus comprising:
  an enclosure having an interior region and comprising a number of walls that are situated adjacent the interior region, the walls being structured to substantially enclose the circuit interruption apparatus within the interior region;
  a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;
  a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto;
  an output apparatus connected with the measurement apparatus and comprising at least a first output device that is structured to generate an output that is representative of a result of the testing operation; and
  wherein the measurement apparatus further comprises a continuity tester that comprises a set of continuity leads that are connected with the set of primary connectors and that is structured to detects electrical continuity between a first subset of the set of primary connectors and a second subset of the set of primary connectors when the circuit interruption apparatus is connected with the primary connectors and is in an ON condition, and wherein the output apparatus comprises a continuity output element that is structured to be in either a first state that is representative of an existence of such continuity or a second state that is representative of an absence of such continuity.

9. A testing apparatus that is structured to perform a number of operations on a circuit interruption apparatus, the testing apparatus comprising:
an enclosure having an interior region and comprising a number of walls that are situated adjacent the interior region, the walls being structured to substantially enclose the circuit interruption apparatus within the interior region;
a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;
a measurement apparatus comprising at least first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity being applied thereto;
an output apparatus connected with the measurement apparatus and comprising at least a first output device that is structured to generate an output that is representative of a result of the testing operation;
wherein the enclosure comprises a layer of a shielding material that is structured to resist the transmission of X-rays between the interior region and the exterior of the testing apparatus; and
wherein the at least first instrument is a vacuum integrity tester that is configured to perform as the testing operation a vacuum integrity test wherein a voltage is applied between a first subset of the set of primary connectors and a second subset of the set of primary connectors when the circuit interruption apparatus is connected with the primary connectors and is in an OFF condition, wherein any current flow between the first subset and the second subset is detected and measured, and wherein a vacuum integrity output that is representative of the current flow is provided by the output apparatus.

10. The testing apparatus of claim 9 wherein the vacuum integrity output is one of a PASS indication and a FAIL indication.

11. The testing apparatus of claim 9 wherein the power component comprises a transformer, and wherein the measurement component comprises a ammeter.

12. A testing apparatus that is structured to perform a number of operations on a circuit interruption apparatus, the testing apparatus comprising:
an enclosure having an interior region and comprising a number of walls that are situated adjacent the interior region, the walls being structured to substantially enclose the circuit interruption apparatus within the interior region;
a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;
a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto;
an output apparatus connected with the measurement apparatus and comprising at least a first output device that is structured to generate an output that is representative of a result of the testing operation; and
wherein the at least first instrument is a primary resistance tester that is configured to perform as the testing operation a primary resistance test wherein a current is supplied to a first subset of the set of primary connectors when the circuit interruption apparatus is connected with the primary connectors and is in an ON condition, wherein a resistance between the first subset and a second subset of the set of primary connectors is detected and measured, and wherein a primary resistance output that is representative of the resistance is provided by the output apparatus.

13. A testing apparatus that is structured to perform a number of operations on a circuit interruption apparatus, the testing apparatus comprising:
an enclosure having an interior region and comprising a number of walls that are situated adjacent the interior region, the walls being structured to substantially enclose the circuit interruption apparatus within the interior region;
a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;
a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto;

an output apparatus connected with the measurement apparatus and comprising at least a first output device that is structured to generate an output that is representative of a result of the testing operation; and wherein the at least first instrument is a timing tester that is configured to perform as the testing operation a timing test wherein the power component generates a trigger to cause the circuit interruption apparatus to be switched from an ON condition to an OFF condition, wherein the measurement component comprises a timer that measures a period of time between the generation of the trigger and the circuit interruption apparatus being in a state where current ceases to flow therethrough, and wherein a timing output that is representative of the time is provided to the output apparatus.

14. A testing apparatus that is structured to perform a number of operations on a circuit interruption apparatus, the testing apparatus comprising:

an enclosure having an interior region and comprising a number of walls that are situated adjacent the interior region, the walls being structured to substantially enclose the circuit interruption apparatus within the interior region;

a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;

a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when the electricity is being applied thereto;

an output apparatus connected with the measurement apparatus and comprising at least a first output device that is structured to generate an output that is representative of a result of the testing operation; and wherein the connection apparatus further comprises a guard apparatus which includes a number of guard elements that are situated in the interior region and that are movable between a first position at least partially overlying the set of primary connectors and a second position at least partially offset from the set of primary connectors, the guard apparatus being structured to be engaged by the circuit interruption apparatus and to be thereby moved from the first position toward the second position when the circuit interruption apparatus is received in the interior region and is being moved in a direction generally toward the set of primary connectors.

15. A testing apparatus that is structured to perform a number of operations on a circuit interruption apparatus, the testing apparatus comprising;

an enclosure having an interior region and comprising a number of walls that are situated adjacent the interior region, the walls being structured to substantially enclose the circuit interruption apparatus within the interior region;

a connection apparatus comprising a set of primary connectors mounted to the enclosure and situated generally within the interior region, the set of primary connectors being structured to become electrically connected with a corresponding set of line and load electrical connectors of the circuit interruption apparatus when the circuit interruption apparatus is received in the interior region;

a measurement apparatus comprising at least a first instrument and a plurality of leads, the at least first instrument comprising a power component and a measurement component, at least the power component and the plurality of leads being enclosed within the interior region, the plurality of leads comprising a set of power leads and a set of measurement leads, the set of power leads being electrically connected with the set of primary connectors and with the power component, the set of measurement leads being electrically connected with the set of primary connectors and with the measurement component, the measurement apparatus being structured to perform a testing operation on the circuit interruption apparatus wherein the power component applies electricity to the circuit interruption apparatus and wherein the measurement component measures an electrical property of the circuit interruption apparatus when, the electricity is being applied thereto;

an output apparatus connected with the measurement apparatus and comprising at least a first output device that is structured to generate an output that is representative of a result of the testing operation; and wherein the connection apparatus further comprises a switching apparatus, the set of power leads and the set of measurement leads being electrically connected between the set of primary connectors and the switching apparatus, and wherein the at least first instrument comprises a first instrument and a second instrument, the switching apparatus being movable between:

a first state wherein the set of power leads and the set of measurement leads are electrically connected with the first instrument and are electrically disconnected from the second instrument, and a second state wherein the set of power leads and the set of measurement leads are electrically connected with the second instrument and are electrically disconnected from the first instrument.

* * * * *